(12) United States Patent
Maeda

(10) Patent No.: US 7,719,022 B2
(45) Date of Patent: May 18, 2010

(54) PHOSPHOR ILLUMINATION OPTICS FOR LED LIGHT SOURCES

(75) Inventor: Patrick Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/115,867

(22) Filed: May 6, 2008

(65) Prior Publication Data

US 2009/0278146 A1 Nov. 12, 2009

(51) Int. Cl.
 *H01L 33/00* (2010.01)
(52) U.S. Cl. .................. 257/98; 257/E33.068
(58) Field of Classification Search ........... 257/98, 257/99, 100, 676, 13, 79, E25.032, E33.068; 438/22, 25, 26, 69, 72; 362/553, 545, 554, 362/241, 612, 555; 313/110, 313, 498, 502
See application file for complete search history.

(56) References Cited

U.S. PATENT DOCUMENTS

| | | | |
|---|---|---|---|
| 5,813,752 A | | 9/1998 | Singer et al. |
| 6,160,273 A * | | 12/2000 | Fork et al. ............ 257/98 |
| 6,833,565 B2 * | 12/2004 | Su et al. ............ 257/98 |
| 6,994,453 B2 | 2/2006 | Blanchard | |
| 7,108,386 B2 | 9/2006 | Jacobson et al. | |
| 7,210,977 B2 | 5/2007 | Ouderkirk et al. | |
| 2005/0006659 A1 * | 1/2005 | Ng et al. ............ 257/99 |
| 2005/0117125 A1 | 6/2005 | Minano et al. | |
| 2006/0170335 A1 | 8/2006 | Cho et al. | |
| 2007/0085075 A1 * | 4/2007 | Yamazaki et al. ....... 257/40 |
| 2007/0085196 A1 * | 4/2007 | Chen et al. ............ 257/712 |
| 2008/0054281 A1 * | 3/2008 | Narendran et al. ....... 257/98 |
| 2008/0283864 A1 * | 11/2008 | LeToquin et al. ....... 257/101 |
| 2009/0173958 A1 * | 7/2009 | Chakraborty et al. ..... 257/98 |

* cited by examiner

*Primary Examiner*—Thomas L Dickey
*Assistant Examiner*—Nikolay Yushin
(74) *Attorney, Agent, or Firm*—Oliff & Berridge, PLC (57) ABSTRACT

Devices and methods for collecting and distributing light from a light emitting diode (LED) emitter onto a phosphor layer to produce substantially white light are provided. The devices may include a reflective cavity with a reflective material, surrounding the reflective cavity, with a reflective side of the reflective material facing towards the inside of the reflective cavity. Further, the devices may incorporate an LED on one end of the reflective cavity and a phosphor layer on another end. Additionally, the devices may use a gradient index (GRIN) rod lens to refract light produced from the LED onto a phosphor surface with an LED on one end of the GRIN rod lens and the phosphor layer on the other end.

6 Claims, 7 Drawing Sheets

PHOSPHOR ILLUMINATION OPTICS FOR LED LIGHT SOURCES

BACKGROUND

This disclosure is directed to devices and methods for collecting and distributing light from a light emitting diode (LED) emitter onto a phosphor.

LEDs are commonly used in lighting markets as light sources and typically produce light which is perceived by the human eye as a single color. For example, some of the colored light emitted by an LED may include red, blue and green. However, lighting markets such as task lighting for outdoor and interior uses, automotive lights, copier lamps in xerographic machines, and lamps in scanners use white light. Therefore, an approach for using the colored light emitted from an LED to generate white light involves using a phosphor layer to absorb some or all of the light emitted from the LED. After the light passes through the phosphor layer, some of the light is absorbed, converted, and emitted in a range of lower wavelengths. Some of the light is transmitted through the phosphor. The combination of the phosphor converted light and the transmitted light is perceived as white.

Conventional devices combining LEDs with phosphor layers to collect and combine the light emitted from the LED to generate white light are known. Some conventional solutions use total internal reflection to collect the light generated from the LED, as disclosed in U.S. Patent Application Publication No. 2005/0117125, which requires optical alignment and surfaces which must remain free of contact in order to provide the required functionality. Further, U.S. Patent Application Publication No. 2006/0170335 discloses a device using a reflector cup where the sides of the reflector cup are a rough surface. Additionally, the use of short wave pass filters and long wave pass filters, in addition to the phosphor layers, are disclosed in U.S. Pat. No. 5,813,752; U.S. Pat. No. 6,994,453; and U.S. Pat. No. 7,210,977.

Additionally, conventional devices use refraction to collect and distribute the light from the LED to the phosphor layer, as disclosed in U.S. Pat. No. 7,108,386, which discloses a non-imaging optical coupler to collect the light from the LED.

Figure 1:
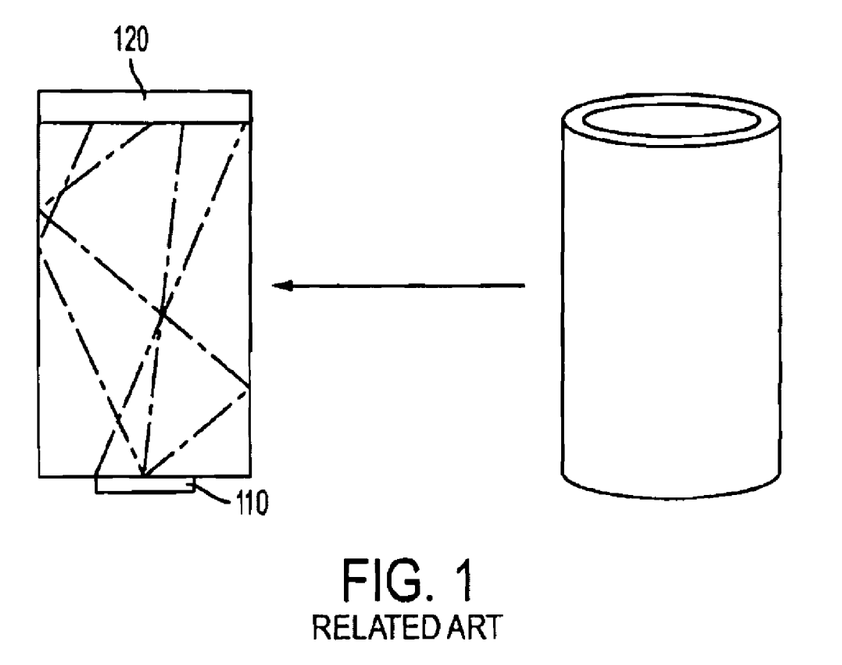
FIG. 1 illustrates a conventional device for collecting and distributing light emitted from a LED.

Another conventional solution for collecting and distributing light emitted from an LED onto a phosphor surface includes forming a small hollow reflective cavity by rolling a high reflectance film and inserting the rolled film into a molded plastic part, as illustrated in FIG. 1. However, in this solution, since the reflectance film is inserted into the molded plastic part, it is difficult to adopt a consistent configuration within the cavity. Further, the film may become twisted and folded preventing efficient collection of light from the LED.

Drawbacks of the above-discussed conventional devices and methods for collecting and distributing light emitted from an LED onto a phosphor surface include difficulty in obtaining consistent geometry when using the rolled film and difficulty of assembly of the hollow reflective cavity. Conventional solutions also require the phosphor surface to be larger in area than the LED emitter surface.

SUMMARY

Thus, this disclosure is directed to systems and methods of efficient collection of light and balancing of light generated from an LED, in combination with a phosphor layer for production of white light.

It would be advantageous, in view of the above-identified shortfalls, to provide methods and systems that would enable high light collection efficiency from an LED while obtaining a consistent geometry of a light collection apparatus using a rolled reflective material. Additionally, it would also be beneficial to provide an assembly and manufacturing method to produce more reliable collection of the emitted light and to lower production costs. It would be advantageous to achieve a substantial environmental isolation of the system, such as, but not limited to hermetic sealing, to prevent degradation of the system through exposure to humidity or other environmental conditions. Furthermore, it would be advantageous to reduce the illumination area of the phosphor which could enable the scaling of overall system size; such scaling would allow for the methods and systems to be used over a variety of lighting markets.

Additionally, it would be advantageous to further increase light output by reducing illumination wasted due to reflection losses while maintaining or increasing the light collection efficiency of the system. Another advantage would be balancing the light generated from an LED and the corresponding color phosphor for outputting better white light production. Also, it would be beneficial to use the LED as a detector so that different lights may be used, for example, for pulse code modulation for communication.

The systems and methods according to this disclosure include lighting devices including light emitting diodes ("LEDs"). In exemplary embodiments, the LED may be capable of emitting, or may emit, light of various colors. Further, the lighting device may include a luminescent volume within a phosphor layer. The phosphor layers may be capable of converting the incident illumination into various colors, which may correspond to colors associated with the LED emission. Additionally, the lighting device may include a solid dielectric cavity substantially surrounded by a reflective material, wherein the resulting reflective solid dielectric cavity collects and distributes light from the LED onto the luminescent volume. The reflectance material may be wrapped in a manner in which the reflective side is facing towards the inside of the dielectric cavity. The solid dielectric cavity may also be formed by filling the empty space volume formed by the reflective material with a material, such as, for example, a curable transparent material allowing for hermetic sealing or other substantial isolating of the LED, reflective material, and phosphor layer from the external environment, thus preventing degradation from exposure to humidity and other external conditions. Additionally, the reflective material may include, but not be limited to, a reflectance film or any flexible material that has a multi-layer interference coating.

Exemplary embodiments may include a short wavelength pass filter between the luminescent volume and the reflective solid dielectric cavity. The short wavelength pass filter may reflect radiated light from the luminescent layer to increase the amount of light available for collection by the lighting system.

In exemplary embodiments, the short wavelength pass filter may be placed between the LED and the reflective solid dielectric cavity.

Additionally, in exemplary embodiments a complex color filter may be placed above the luminescent layer or between the luminescent layer, and the short wavelength pass filter.

Exemplary embodiments may comprise a lighting device including a LED; a phosphor surface; and a gradient index (GRIN) rod lens, in which the GRIN rod lens collects and distributes light from the LED onto the phosphor surface. The GRIN rod lens may be, for example, a SELFOC® Lens. Additionally, the GRIN rod lens may have a radially varying refractive index profile allowing for the collection and direction of the light emitted from the LED. Further, the lighting device may have the phosphor surface area similar to or smaller than the LED surface area allowing for scaling of the overall system size.

In exemplary embodiments, the short wavelength pass filter may be placed between the luminescent layer and GRIN rod lens.

Additionally, in exemplary embodiments, a complex color filter may be placed above the phosphor layer or between the phosphor layer, and the short wavelength pass filter.

Exemplary embodiments may comprise a lighting device including a LED; a phosphor layer; a hollow reflective cavity that collects and distributes light from the LED onto the phosphor surface; and a short wavelength pass filter between the phosphor and the hollow reflective cavity.

Further, in exemplary embodiments, a complex color filter may be placed above the phosphor layer with a short wavelength pass filter between the phosphor layer and the hollow reflective cavity.

Other exemplary embodiments of the systems and methods according to this disclosure may include a method for forming a reflective solid dielectric cavity. The method may include placing a reflectance material around a dielectric rod or dielectric element; fixing the reflectance material to the dielectric rod; and cleaving the resulting structure into individual reflective solid cavities. The rod may have a circular, elliptical, square, rectangular, or other geometric cross-section shape. The reflectance material may be wrapped in a manner in which the reflective side is facing toward the inside of the dielectric rod. The dielectric rod or element may comprise any structure or configuration which may be desired. Another method may form the reflective solid dielectric cavity by filling the empty space volume, bounded by the reflective material, with a curable transparent material. Additionally, the method may include partial filling of the empty space volume with a curable transparent material.

These and other features and advantages of the disclosed embodiments are described in, or apparent from, the following detailed description of various exemplary embodiments.

BRIEF DESCRIPTION OF THE DRAWINGS

Various exemplary embodiments of disclosed devices and methods will be described, in detail, with reference to the following figures, wherein.

DETAILED DESCRIPTION OF EMBODIMENTS

The following description of various exemplary embodiments of devices and methods for collecting and distributing light from a LED emitter onto a phosphor may use a reflectance material wrapped around a dielectric cavity to reflect the light emitted from the LED onto the phosphor layer. The dielectric cavity may be placed between the LED and the phosphor layer and it should be appreciated that the reflectance material may be a high reflectance film readily available for a low price, such as, for example, an ESR or Alanod film, or any similar type of film. Further, it should be appreciated that examples of the reflectance material may include a silver coated material, a silver flexible material, or any flexible material that has a multi-layer interference coating. For example, the reflectance material may have a reflectance greater than about 90% across the visible wavelengths at about 400 nm to about 800 nm wavelengths. Additionally, the reflectance material may have reflectance over a large range of incident angles.

In exemplary embodiments, the lighting device may include a dielectric cavity with a reflective material around it, in which the resulting reflective dielectric cavity collects and distributes light from the LED onto the luminescent surface. The reflectance material may be wrapped in a manner in which the reflective side is facing toward the inside of the dielectric cavity. It should be appreciated that the dielectric cavity may be, but is not limited to, a glass or plastic rod. Further, the dielectric cavity may be formed of any other material capable of focusing light and may be of any shape or configuration capable of reflecting light, including, for example, a cylinder. Additionally, the LED and the luminescent layer may be of any desired color, and the cavity of other like solid or hollow structure.

Figure 2A:
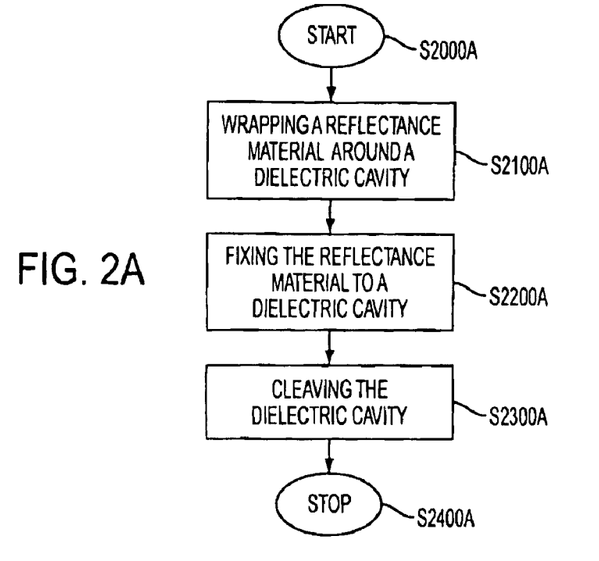
FIGS. 2A and 2B illustrate flow charts disclosing a method for forming a reflective dielectric cavity according to this disclosure.

FIG. 2A illustrates a flow chart of an exemplary method of forming a reflective dielectric cavity. The method begins at step S2000A, and may be initiated automatically or manually. For example, the method may be performed automatically during a manufacturing process.

In step S2100A, a reflectance material may be placed around a dielectric rod. It should be appreciated that the reflectance material may be wrapped around the dielectric rod or associated with the dielectric rod by any other method which may surround the dielectric rod with the material. The reflectance material may be wrapped in a manner in which the reflective side is facing towards the inside of the dielectric rod.

In step S2200A, the reflectance material may be fixed to the dielectric rod. It should be appreciated that the reflectance material may be adhered to the dielectric rod. Additionally, it should be appreciated that any other method which would place the reflective material around the dielectric cavity may be used.

In step S2300A, the resulting reflective dielectric rod may be cleaved into individual cavities. It should be appreciated that the cavity may be cleaved with any standard process for cleaving. For example, the reflective dielectric rod may be cut, scribed, and fractured along the cleaved line when pressure is added. To achieve smoother surfaces and improved surface quality without pits, gouges, or similar defects on the surface, a laser or other high precision instrument may be used in the cleaving process.

Figure 2B:
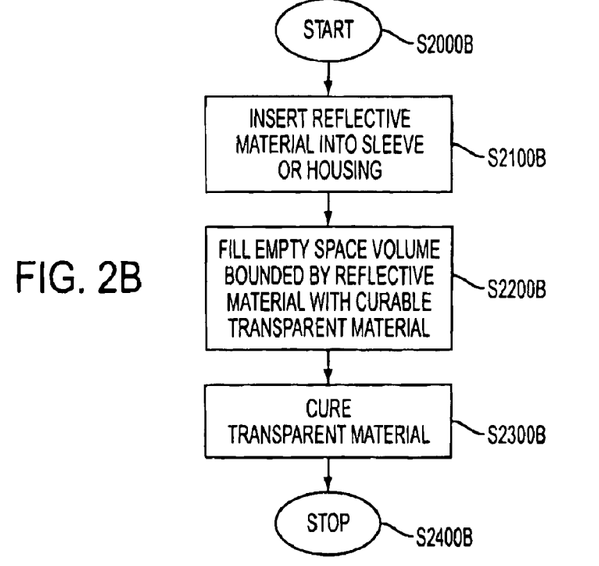

FIG. 2B illustrates a flow chart disclosing an alternative method for forming a reflective dielectric cavity. Operation of the method begins at step S2000B. The method may be initiated automatically or manually. For example, the method may be performed automatically during a manufacturing process.

In step S2100B, a reflective air-filled cavity may be formed by inserting the reflective material into a rod-shaped sleeve or housing.

In step S2200B, the empty space volume bounded by the reflective air-filled cavity is filled with a curable transparent material. In order to help keep the reflective material in place and to preserve uniform geometry of the cavity, the cavity may be filled partially or fully with a curable transparent material, in order to, for example, provide an air gap, which may be advantageous in the use of additional optical coatings. Providing a curable transparent material in this manner and sealing the device may allow for hermetic sealing, or other substantial environmental isolation, which may prevent or minimize degradation from exposure to humidity and other environmental conditions.

In step S2300B, the transparent material may be cured. For example, a transparent curing material may be cured by exposure to ultraviolet (UV) light until curing is completed.

Operation of the method continues to step S2400B where operation of the method ceases.

Figure 3:
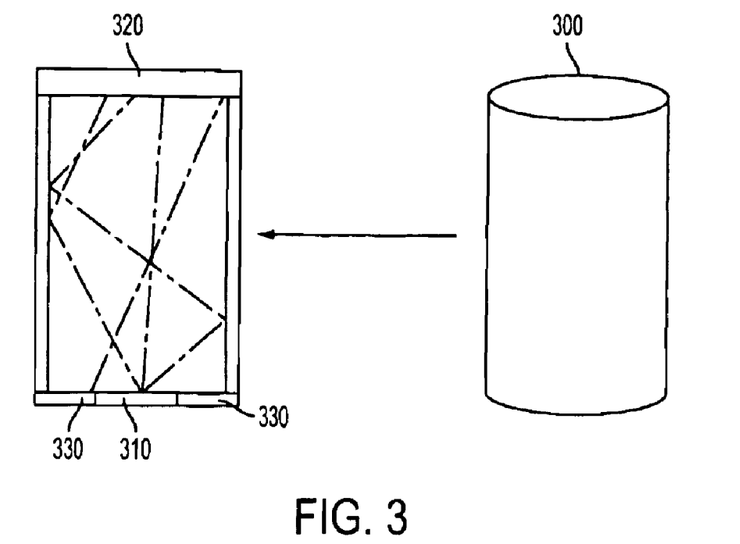
FIG. 3 illustrates an exemplary embodiment of the lighting device with a solid reflective dielectric cavity.

FIG. 3 illustrates an exemplary embodiment of the lighting device with a solid reflective dielectric cavity. In one exemplary embodiment, light may be emitted from the LED 310 into a hemisphere allowing the solid reflective dielectric cavity 300 to collect the light emitted from LED 310 and deliver it onto the phosphor layer 320. The LED 310 may be positioned at one end of the solid reflective dielectric cavity 300 with the phosphor layer 320 on the opposite end of the solid reflective dielectric cavity 300. An additional reflective layer 330 at the base of the cavity alongside the LED may also be included to reflect any back-emitted phosphor converted light or any light emitted from the LED that may be back reflected or back scattered from the phosphor layer.

In another exemplary embodiment the reflective air-filled cavity 300 can be injected with a curable transparent material. The curable transparent material may allow for hermetic sealing, or other substantial environmental isolation, which may prevent or minimize degradation from exposure to humidity and other environmental conditions.

Figure 4:
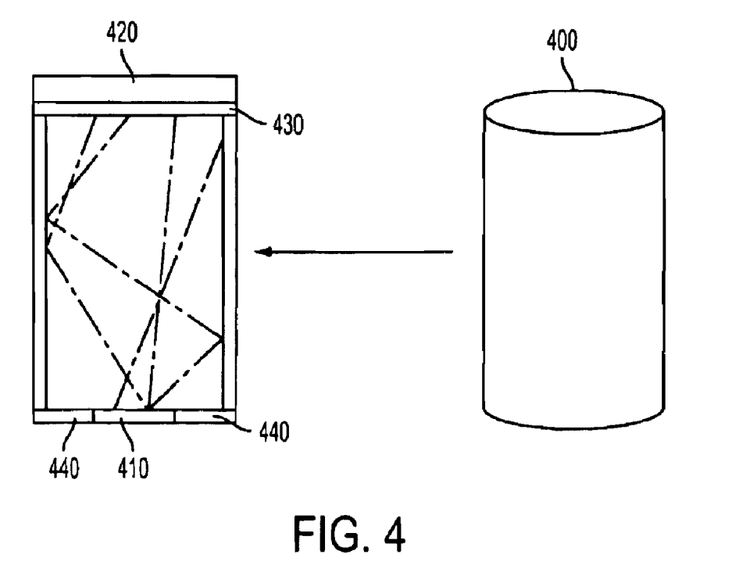
FIG. 4 illustrates an exemplary embodiment of the lighting device with a solid reflective dielectric cavity and a shortwave pass filter.

FIG. 4 illustrates an exemplary embodiment of the lighting device with a solid reflective dielectric cavity and a shortwave pass filter. In an exemplary embodiment, light may be emitted from the LED 410 into a hemisphere of the solid reflective dielectric cavity 400 onto the phosphor layer 420. The solid reflective dielectric cavity 400 may be placed between the LED 410 and the phosphor layer 420. A shortwave pass filter 430 may be placed between the solid reflective dielectric cavity 400 and the phosphor layer 420. An additional reflective layer 440 at the base of the cavity alongside the LED may also be included to reflect any back-emitted phosphor converted light or any light emitted from the LED that may be back reflected or back scattered from the phosphor layer.

The shortwave pass filter 430 may reflect radiated light from the phosphor layer 420 into the forward direction toward the phosphor layer 420, increasing the amount of light available for collection by the lighting system. For example, the shortwave pass filter 430 may reflect yellow light emitted from the phosphor layer 420 toward the phosphor layer 420, while allowing the blue light from the LED 410 to pass through the shortwave pass filter 430 to the phosphor layer 420.

Figure 5:
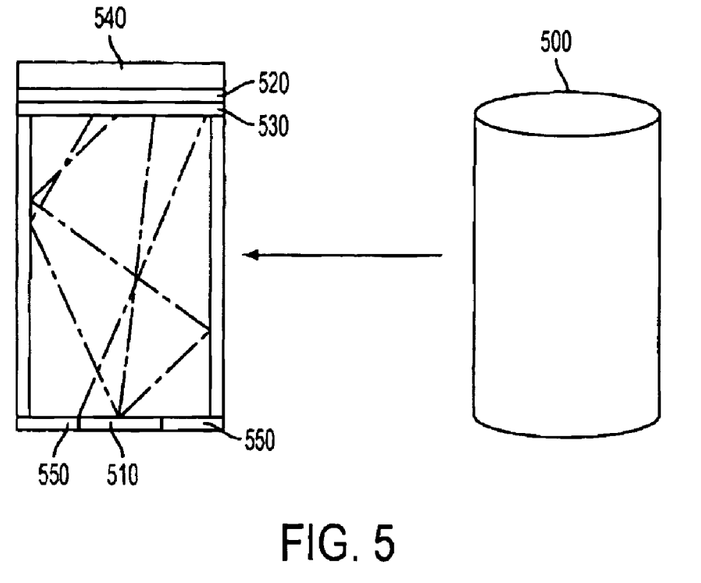
FIG. 5 illustrates an exemplary embodiment of the lighting device with a solid reflective dielectric cavity and a shortwave pass filter and a complex color filter.

FIG. 5 illustrates an exemplary embodiment of the lighting device with a solid reflective dielectric cavity 500 and a shortwave pass filter 530 and a complex color filter 540.

Figure 7:
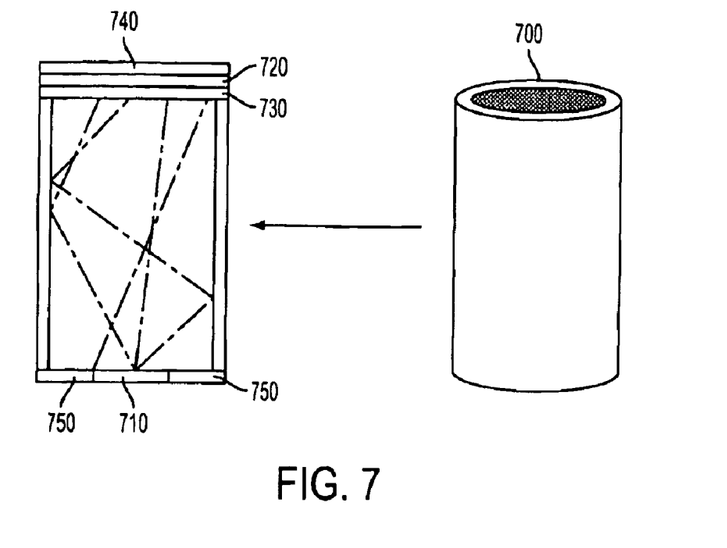
FIG. 7 illustrates an exemplary embodiment of the lighting device with a hollow reflective dielectric cavity, a shortwave pass filter and a complex color filter.

FIG. 7 illustrates an exemplary embodiment of the lighting device with a hollow reflective dielectric cavity 700, a shortwave pass filter 730 and a complex color filter 740.

A complex color filter 540, 740 may be placed above the phosphor layer 520, 720 balancing blue light emitted from the LED 510, 710 with green/red phosphor output to more accurately reproduce white light. The complex color filter 540, 740 may shape the wavelength of the light, and therefore its color content, as the light exits the device. For example, if the desired light has a bluish tint, the complex color filter may be used to transmit more of the blue light emitted from the LED 510, 710, or absorb more of the green/red light emitted by the phosphor. An additional reflective layer 550, 750 at the base of the cavity alongside the LED may also be included to reflect any back-emitted phosphor converted light or any light emitted from the LED that may be back reflected or back scattered from the phosphor layer. Conversely, if the desired light is more yellow in tint the complex color filter may be used to absorb more of the blue light emitted from the LED 510, 710.

Additionally, an exemplary embodiment may incorporate a shortwave pass filter 530, 730 below the phosphor layer 520, 720 with the complex color filter 540, 740 above the phosphor layer 520, 720. Further, another exemplary embodiment may incorporate the shortwave pass filter between the LED 510, 710 and the solid reflective dielectric cavity 500, 700.

Figure 6:
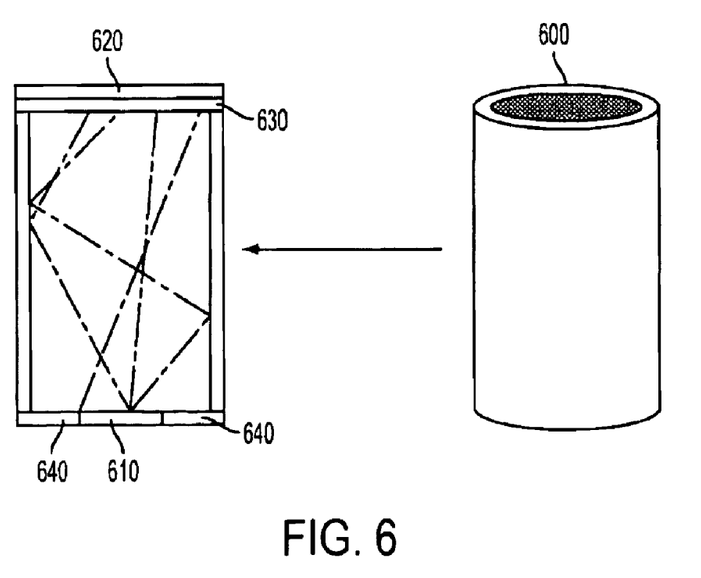
FIG. 6 illustrates an exemplary embodiment of the lighting device with a hollow reflective dielectric cavity and a shortwave pass filter.

FIG. 6 illustrates an exemplary embodiment of the lighting device with a hollow reflective cavity and a shortwave pass filter. In an exemplary embodiment, light may be emitted from the LED 610 into a hemisphere of the hollow reflective cavity 600 onto the phosphor layer 620. The hollow reflective cavity 600 can be placed between the LED 610 and the phosphor layer 620. A shortwave pass filter 630 may be placed between the hollow reflective dielectric cavity 600 and the phosphor layer 620. An additional reflective layer 640 at the base of the cavity alongside the LED may also be included to reflect any back emitted phosphor converted light or any light emitted from the LED that may be back reflected or back scattered from the phosphor layer.

In another exemplary embodiment, as shown in FIG. 7, a shortwave pass filter 730 may be placed between the hollow reflective cavity 700 and the phosphor layer 720. Additionally, the shortwave pass filter 730 may be deposited on a transparent substrate.

Figure 8:
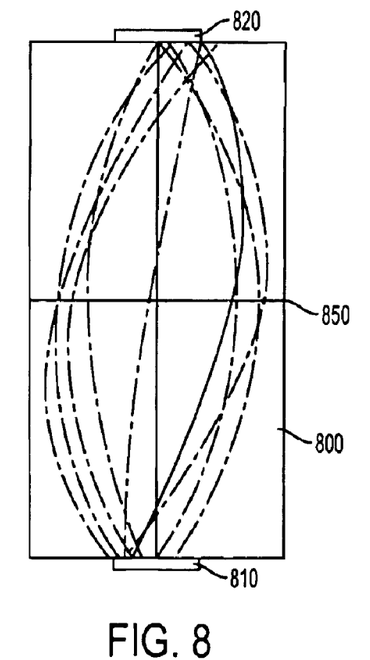
FIG. 8 illustrates an exemplary embodiment of the lighting device with a GRIN rod lens.

FIG. 8 illustrates an exemplary embodiment of the lighting device using refraction with a gradient index (GRIN) rod lens. In exemplary embodiments light may be emitted from the LED 810 into a hemisphere allowing the GRIN rod lens 800 to (1) collect and focus the light emitted from LED 810, and (2) deliver the collected light onto the phosphor layer 820. The GRIN rod lens may have a radially varying refractive index profile allowing for the collection and direction of the light emitted from the LED 810 onto the phosphor layer 820 whose area may be similar to or smaller than the LED 810 surface area. Providing a smaller phosphor layer 820 area than the LED 810 surface area allows for flexibility in scaling the overall system size.

In exemplary embodiments, the GRIN rod lens 800 may be, for example, a SELFOC lens. GRIN rod lenses are known, and the properties of the lenses will not be further discussed. GRIN rod lenses of different physical lengths and focal lengths may be used. Additionally, the phosphor layer 820 may be used with a GRIN rod lens that is approximately half the length of GRIN rod lens 800 at a length 850 where a uniform circular irradiance distribution of light occurs. The phosphor layer 820 may, otherwise, be used with GRIN rod lenses are shorter or longer than the GRIN rod lens 800.

Figure 9:
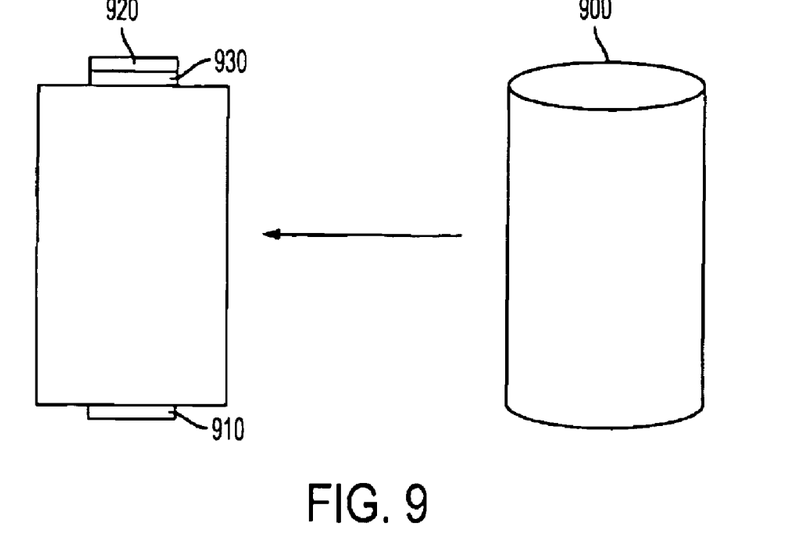
FIG. 9 illustrates an exemplary embodiment of the lighting device with a GRIN rod lens and a shortwave pass filter.

FIG. 9 illustrates an exemplary embodiment of the lighting device with a GRIN rod lens and a shortwave pass filter. A shortwave pass filter 930 may be placed between the GRIN rod lens 900 and the phosphor layer 920. Additionally, the shortwave pass filter 930 may be deposited on a transparent substrate.

Figure 10:
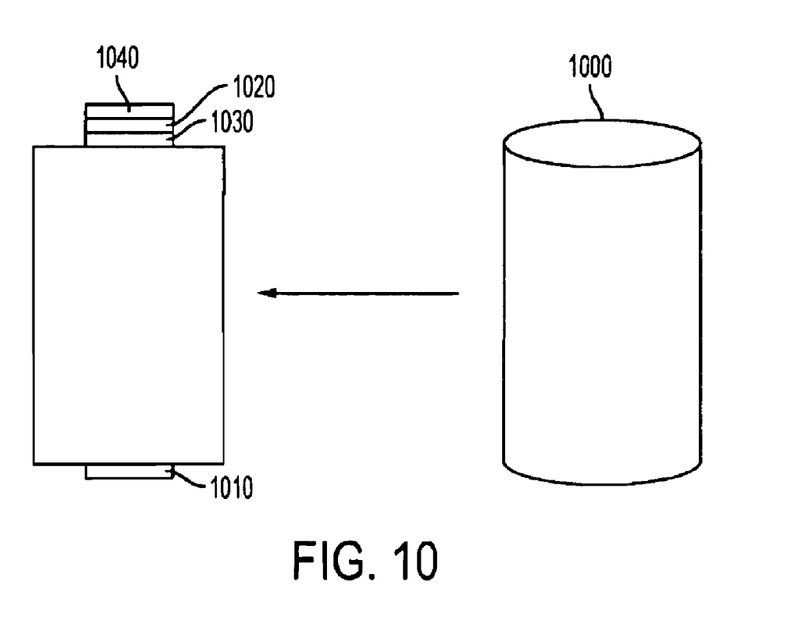
FIG. 10 illustrates an exemplary embodiment of the lighting device with a GRIN rod lens, a shortwave pass filter and a complex color filter.

FIG. 10 illustrates an exemplary embodiment of the lighting device with a GRIN rod lens, a shortwave pass filter and a complex color filter. The complex color filter 1040 may be placed above the phosphor layer 1020, balancing blue light emitted from the LED 1010 and green/red phosphor output to more accurately reproduce white light. The complex color filter 1040 may, thus, shape the wavelength spectrum of the light, in terms of color contents, as it exits the device.

Figure 11:
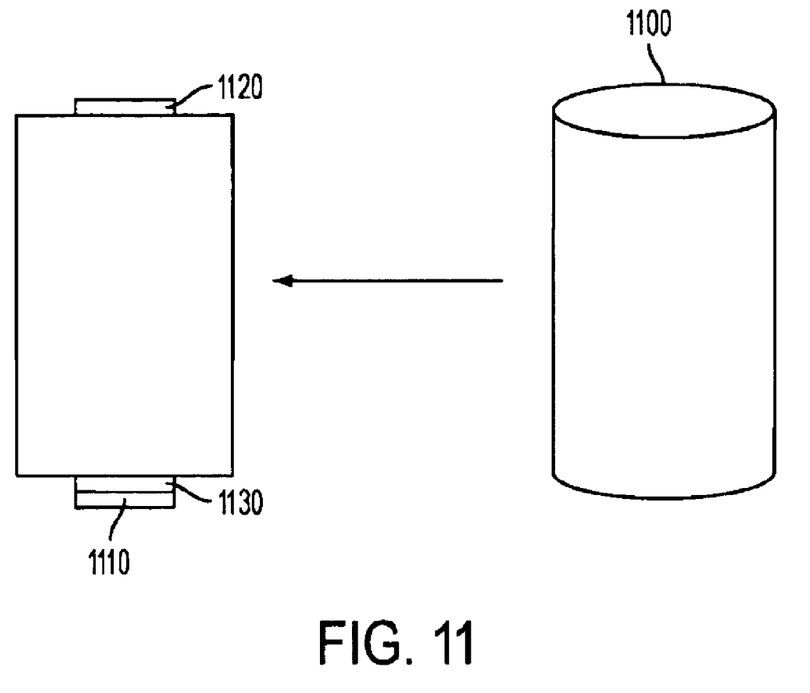
FIG. 11 illustrates an exemplary embodiment of the lighting device with a GRIN rod lens and a shortwave pass filter.

Additionally, exemplary embodiments may incorporate a shortwave pass filter 1030 below the phosphor layer 1020 with the complex color filter 1040 above the phosphor layer 1020. Further, exemplary embodiments may incorporate the shortwave pass filter 1130 between the LED 1110 and the GRIN rod lens 1100, as illustrated in FIG. 11.

In another exemplary embodiment, the LED may be used as a detector, by reversing the polarity of electricity applied to the LED to allow the LED to detect incoming light. The LED may be able to detect light at frequencies not visible to the human eye, allowing for the detection of signaling and communications between lighting fixtures. For example, the LED may receive a signal to brighten or darken the light emitted, then the LED in turn may provide a communication to darken or brighten the light.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A lighting device, comprising:
   a light emitting diode;
   a phosphor layer having a phosphor surface, the phosphor surface collecting light emitted from the light emitting diode; and
   a GRIN rod lens, wherein the GRIN rod lens collects and distributes light from the light emitting diode onto the phosphor surface, wherein
   a top plane of the phosphor surface is similar to or smaller than a surface area of the light emitting diode, and
   the GRIN lens has a pitch of about 0.5.

2. The lighting device of claim 1, wherein the GRIN rod lens comprises a SELFOC lens.

3. The lighting device of claim 1, further comprising a short wavelength pass filter disposed between the phosphor layer and the GRIN rod lens.

4. The lighting device of claim 1, further comprising a short wavelength pass filter disposed between the light emitting diode and the GRIN rod lens.

5. The lighting device of claim 3, further comprising a complex color filter disposed above the phosphor layer.

6. The lighting device of claim 3, further comprising a complex color filter disposed between the phosphor layer and the short wavelength pass filter.

* * * * *